(12) United States Patent
Lim

(10) Patent No.: US 9,966,956 B2
(45) Date of Patent: May 8, 2018

(54) SEMICONDUCTOR INTEGRATED CIRCUIT DEVICE

(71) Applicant: SK hynix Inc., Icheon-si, Gyeonggi-do (KR)

(72) Inventor: Jung Ho Lim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 50 days.

(21) Appl. No.: 15/225,420

(22) Filed: Aug. 1, 2016

(65) Prior Publication Data

US 2017/0272076 A1    Sep. 21, 2017

(30) Foreign Application Priority Data

Mar. 18, 2016  (KR) .................. 10-2016-0032793

(51) Int. Cl.
*H03K 19/0185* (2006.01)
*H03K 19/0948* (2006.01)

(52) U.S. Cl.
CPC . *H03K 19/018521* (2013.01); *H03K 19/0948* (2013.01)

(58) Field of Classification Search
None
See application file for complete search history.

(56) References Cited

U.S. PATENT DOCUMENTS

| 6,177,819 | B1* | 1/2001 | Nguyen | H03K 17/04206 326/27 |
| 2003/0122572 | A1* | 7/2003 | Ajit | H03K 19/0005 326/30 |
| 2017/0170831 | A1* | 6/2017 | Lim | H03K 19/00384 |

FOREIGN PATENT DOCUMENTS

KR    1020060125855 A    12/2006

* cited by examiner

*Primary Examiner* — Jany Richardson
(74) *Attorney, Agent, or Firm* — William Park & Associates Ltd.

(57) ABSTRACT

A semiconductor integrated circuit device may include a main inverter and a negative bias temperature instability (NBTI) compensating circuit. The main inverter may be configured to receive an input signal. The main inverted may be configured to reverse the input signal. The main inverter may include a PMOS transistor and an NMOS transistor. The NBTI compensating circuit may be configured to receive the input signal. The NBTI compensating circuit may be selectively driven in an operation start time section of the PMOS transistor in the main inverter to compensate a driving force of the PMOS transistor.

14 Claims, 3 Drawing Sheets

SEMICONDUCTOR INTEGRATED CIRCUIT DEVICE

CROSS-REFERENCES TO RELATED APPLICATION

The present application claims priority under 35 U.S.C. § 119(a) to Korean application number 10-2016-0032793, filed on Mar. 18, 2016, in the Korean Intellectual Property Office, which is incorporated herein by reference in its entirety.

BACKGROUND

1. Technical Field

Various embodiments generally relate to a semiconductor integrated circuit device, and more particularly, to a semiconductor integrated circuit device including a negative bias temperature instability (NBTI) compensating circuit.

2. Related Art

Generally, when a high electric field is applied to a gate of each of PMOS transistors in a semiconductor memory device, a negative bias used in the semiconductor memory device may become unstable because of temperature changes. This may be referred to as a negative bias temperature instability (NBTI). The NBTI may cause an increase in a threshold voltage of the PMOS transistor so that capacities of the semiconductor memory device may deteriorate. As a result, malfunctions may generate from an inverter to which the PMOS transistor may be applied.

SUMMARY

According to an embodiment, there may be provided a semiconductor integrated circuit device. The semiconductor integrated circuit device may include a main inverter and a negative bias temperature instability (NBTI) compensating circuit. The main inverter may be configured to receive an input signal. The main inverted may be configured to reverse the input signal. The main inverter may include a PMOS transistor and an NMOS transistor. The NBTI compensating circuit may be configured to receive the input signal. The NBTI compensating circuit may be selectively driven in an operation start time section of the PMOS transistor in the main inverter to compensate a driving force of the PMOS transistor.

According to an embodiment, there may be provided a semiconductor integrated circuit device. The semiconductor integrated circuit device may include a core circuit and an NBTI compensating circuit. The core circuit may include a PMOS transistor. The NBTI compensating circuit may be connected with the core circuit in parallel. The NBTI compensating circuit may be selectively driven in an operation start time section of the PMOS transistor in the core circuit to compensate a driving force of the PMOS transistor.

According to an embodiment, there may be provided a semiconductor system. The semiconductor system may include a memory controller, a memory, and an NBTI compensating circuit. The memory may be in communication with the memory controller. The NBTI compensating circuit may be arranged in the memory. The NBTI compensating circuit may be configured to compensate a driving force of a PMOS transistor in the memory. The NBTI compensating circuit may include a first switch, an auxiliary inverter, a PMOS blocking circuit and a second switch. The first switch may be driven in a time section when an input signal to the PMOS transistor may be converted from a high level to a low level. The auxiliary inverter may be connected with the first switch. The auxiliary inverter may include a PMOS transistor and an NMOS transistor. The PMOS blocking circuit may be configured to provide an input node of the auxiliary inverter with a power voltage when the input signal may be a stable high level or a stable low level. The second switch may be connected with an output terminal of the auxiliary inverter. The second switch may have a transfer gate which operates substantially the same as a transfer gate of the first switch.

DETAILED DESCRIPTION

Figure 1:
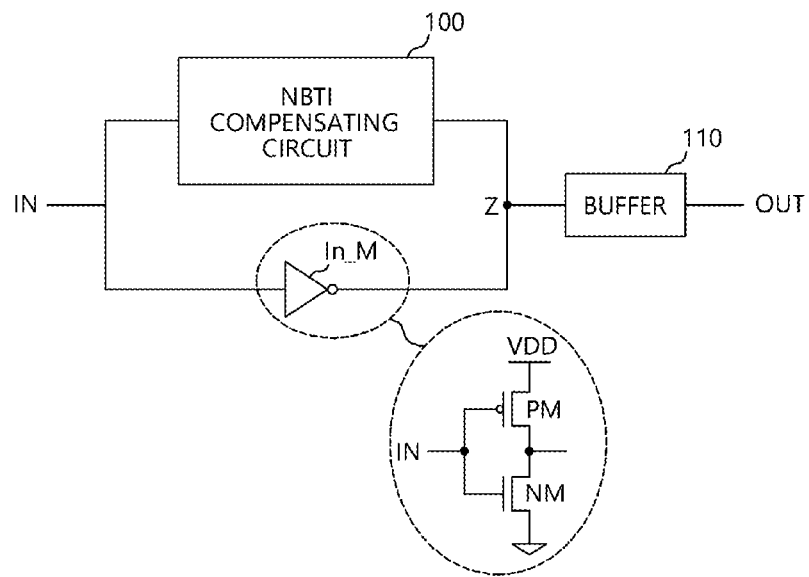
FIG. 1 is a block diagram illustrating a semiconductor integrated circuit device in accordance with example embodiments.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these example embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, the element or layer can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of embodiments will be explained with reference to the accompanying drawings.

FIG. 1 is a block diagram illustrating a semiconductor integrated circuit device in accordance with example embodiments.

Referring to FIG. 1, a semiconductor integrated circuit device may include a main inverter In_M and a negative bias temperature instability (NBTI) compensating circuit 100.

The main inverter In_M may be a core circuit which includes a PMOS transistor PM and an NMOS transistor NM. The main inverter In_M may be configured to receive an input signal IN. The main inverter IN_M may be configured to reverse the input signal IN, where reversing the input signal may include changing a level of the input signal from high to low, or from low to high.

The NBTI compensating circuit 100 may be connected in parallel with the main inverter In_M. The NBTI compensating circuit 100 may be configured to receive the input signal IN.

The semiconductor integrated circuit device may additionally include a buffer 110. The buffer 110 may be configured to receive output signals from the main inverter In_M and the NBTI compensating circuit 100. The buffer 110 may be configured to buffer and output the output signals.

Figure 2:
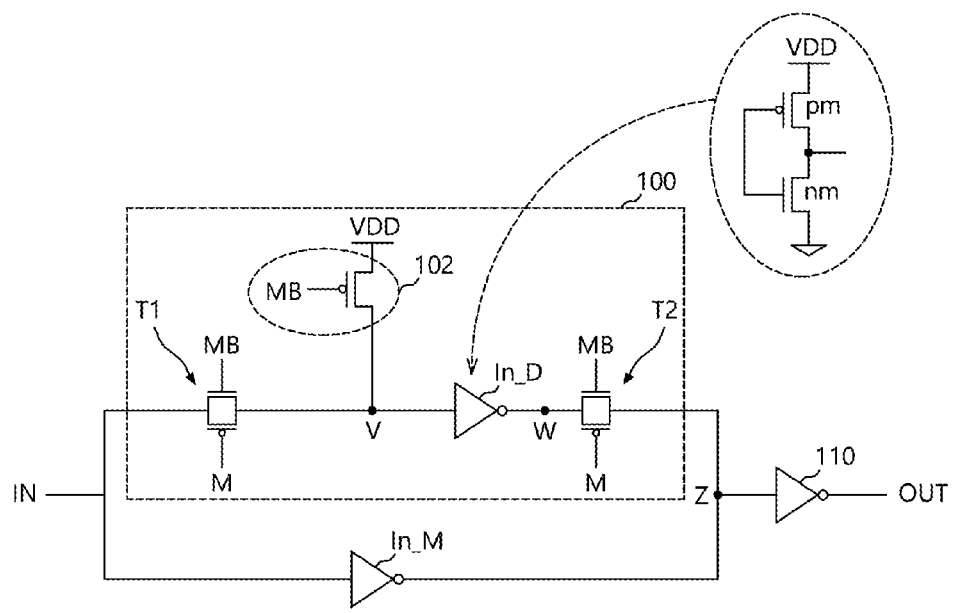
FIG. 2 is a circuit diagram illustrating a semiconductor integrated circuit device in accordance with example embodiments.

FIG. 2 is a circuit diagram illustrating a semiconductor integrated circuit device in accordance with example embodiments.

Referring to FIG. 2, the NBTI compensating circuit 100 may include a first switch T1, a PMOS blocking circuit 102, an auxiliary inverter In_D, and a second switch T2.

The first switch T1 may be configured to selectively transmit the input signal IN in response to a first control signal M and a second control signal MB. The first switch T1 may include a transfer gate driven in response to the first control signal M and the second control signal MB. The transfer gate may include a PMOS transistor input and an NMOS transistor input. The first control signal M may be inputted into the PMOS transistor input. The second control signal MB may be inputted into the N MOS transistor input.

Figure 3:
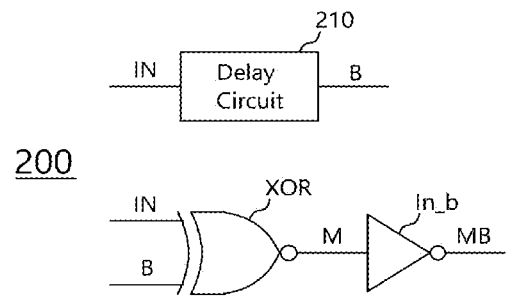
FIG. 3 is a circuit diagram illustrating a control signal generating circuit in accordance with example embodiments.

The first control signal M and the second control signal MB may be obtained from a control signal generating circuit in FIG. 3. Referring to FIG. 3, the control signal generating circuit 200 may include an exclusive-OR element XOR and an inverter In_b. The exclusive-OR element may be configured to receive the input signal IN and an input delay signal B. When the input signal IN and the input delay signal B have a substantially same level, the exclusive-OR element XOR may output a low level. In contrast, when the input signal IN and the input delay signal B have different levels, the exclusive-OR element XOR may output a high level. The input delay signal B may be a reversely delayed signal by a delay circuit 210.

The first control signal M may correspond to an output signal from the exclusive-OR element XOR. The second control signal MB may correspond to the first control signal M reversed by the inverter In_b.

Referring to FIG. 2, the PMOS blocking circuit 102 may be configured to provide a first node V with a power voltage VDD in response to the second control signal MB. In another example, the PMOS blocking circuit 102 may be configured to provide an input node, such as the first node V, with a power voltage VDD when the second control signal MB has a stable high level or a stable low level. The PMOS blocking circuit 102 may include a PMOS transistor. When the second control signal MB is a low level, the PMOS blocking circuit 102 may be driven to provide the first node V with the power voltage VDD.

The auxiliary inverter In_D may include an NMOS transistor nm and a PMOS transistor pm similar to the main inverter In_M, and the auxiliary inverter In_D may be connected with the first switch T1. The auxiliary inverter In_D may have substantially the same size as the main inverter In_M. Alternatively, the auxiliary inverter In_D may have a size different than the main inverter In_M. Here, a reference numeral W may indicate a second node corresponding to an output node of the auxiliary inverter In_D.

The second switch T2 may be configured to provide the buffer 110 with a voltage of the second node W in response to the first control signal M and the second control signal MB. The second switch T2 may include a transfer gate which operates substantially the same as that of the first switch T1, and the second switch T2 may be connected with an output node, that is the second node W of the auxiliary inverter In_D. The second switch T2 may operate substantially the same as the first switch T1. The buffer 110 may include an inverter.

Figure 4:
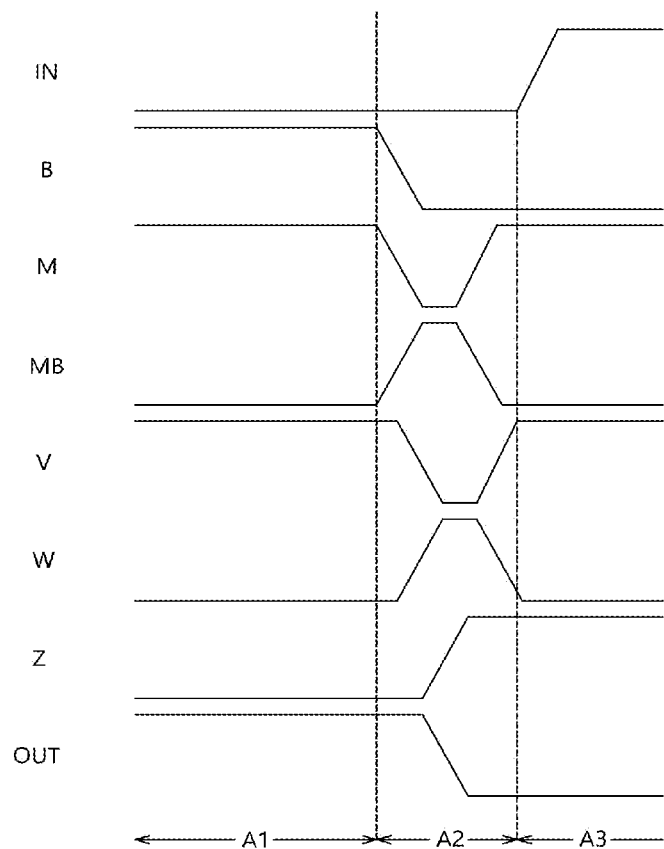
FIG. 4 is a timing chart illustrating operations of a semiconductor integrated circuit device by each node in accordance with example embodiments.

Hereinafter, operations of the semiconductor integrated circuit device may be illustrated with reference to FIG. 4.

When the inverter receives the input signal IN reversed from a high level to a low level, the PMOS transistor PM of the inverter may be driven. The PMOS transistor may be more deteriorated than the NMOS transistor due to the NBTI. Thus, a driving force of the PMOS transistor may be greatly decreased in a time section when the input signal IN is reversed from the high level to the low level.

In example embodiments, the main inverter In_M may be connected in parallel with the auxiliary inverter In_D. The PMOS transistor pm of the auxiliary inverter In_D may be driven simultaneously with the PMOS transistor PM of the main inverter In_M in the time section where the input signal IN is reversed from the high level to the low level.

Therefore, the driving force of the PMOS transistor PM in the main inverter In_M may be improved.

Particularly, the input signal IN may have a pulse shape transited from the high level to the low level. The input delay signal B may have a pulse shape transited from the low level to the high level by the reverse delay circuit 210.

The control signal generating circuit 200 may generate the first control signal M and the second control signal MB by using the exclusive-OR operation on the input signal IN and the input delay signal B. Thus, the first control signal M may be generated to have the pulse shape enabled to the low level in the time section when the input signal IN is transited from the high level to the low level and the input delay signal B is transited from the low level to the high level. The second control signal MB may be generated to have a pulse having a shape generated by reversing the pulse shape of the first control signal M.

When the input signal IN is the high level in A1 time section, the NMOS transistor NM of the main inverter In_M is driven. The first switch T1 of the NBTI compensating circuit 100 may be opened by the first control signal M and the second control signal MB to block the input signal IN inputted into the auxiliary inverter In_D. The PMOS blocking circuit 102 may be turned-on in response to the second control signal MB having the low level. The power voltage VDD may be supplied to the first node V corresponding to the output node of the PMOS blocking circuit 102.

When the power voltage VDD as the first node voltage may be supplied to the auxiliary inverter In_D, the NMOS transistor nm of the auxiliary inverter In_D may be driven. The second switch T2 may be opened by the first control signal M and the second control signal MB. Thus, a voltage of the second node W corresponding to the output signal of the auxiliary inverter In_D may not be transmitted to a third node Z.

The main inverter In_M may be connected with the output node, third node Z, of the NBTI compensating circuit, and the third node Z may receive the output signal of the main inverter In_M. The buffer 110 may reverse a voltage of the third node Z. The buffer 110 may output the reversed voltage as an output signal OUT.

When the input signal IN is transited from the high level to the low level, i.e., the first switch T1 may be driven in a time section and the first control signal M and the second control signal MB are pulsed, operation of the NMOS transistor NM in the main inverter In_M may be stopped and operation of the PMOS transistor PM in the main inverter In_M may be started.

The first switch T1 of the NBTI compensating circuit 100 may operate to transmit the input signal IN to the first node V. Because the second control signal MB may be enabled to the high level in the A2 time section, the PMOS blocking circuit 102 may not be driven.

The PMOS transistor pm of the auxiliary inverter In_D may be driven by inputting the input signal IN transited from the high level to the low level to the auxiliary inverter In_D.

The PMOS transistor pm of the auxiliary inverter In_D may be designed to block operation of the PMOS transistor pm by the first switch T1 and the PMOS blocking circuit 102 when the input signal is the high level or the low level. Thus, deterioration caused by the NBTI of the PMOS transistor pm in the auxiliary inverter In_D may be less than that of the PMOS transistor PM in the main inverter In_M.

The second switch T2 may be driven by the first control signal M and the second control signal MB. The output voltage of the auxiliary inverter In_D may be transmitted to the third node Z.

The output voltages of the main inverter In_M and the auxiliary inverter In_D may be transmitted to the third node Z. That is, the PMOS transistor pm of the auxiliary inverter In_D in which deterioration may not be generated may be driven simultaneously with driving the PMOS transistor PM of the main inverter In_M so that the driving force of the PMOS transistor PM in the main inverter In_M may be compensated. Accordingly, in one embodiment, the NBTI compensating circuit may be selectively driven in an operation start time section of the PMOS transistor PM in the main inverter In_M to compensate a driving force of the PMOS transistor PM.

The voltage of the third node Z may be outputted through the buffer 110 as the output signal OUT.

When the input signal IN is the low level in the A3 time section, the PMOS transistor PM of the main inverter In_M may be driven. The first switch T1 of the NBTI compensating circuit 100 may be opened by the first control signal M and the second control signal MB to block the input signal IN inputted into the auxiliary inverter In_D. The PMOS blocking circuit 102 may be turned-on in response to the second control signal MB having the low level. The power voltage VDD may be supplied to the first node V corresponding to the output node of the PMOS blocking circuit 102.

When the power voltage VDD as the first node voltage is supplied to the auxiliary inverter In_D, the NMOS transistor nm of the auxiliary inverter In_D may be driven, for example, in time sections except the time section when the PMOS transistor pm of the auxiliary inverter In_D is driven. The second switch T2 may be opened by the first control signal M and the second control signal MB. Thus, the voltage of the second node W corresponding to the output signal of the auxiliary inverter In_D may not be transmitted to the third node Z.

The third node Z may receive the output signal of the main inverter In_M. The buffer 110 may reverse the voltage of the third node Z. The buffer 110 may output the reversed voltage as the output signal OUT.

In example embodiments, an auxiliary PMOS transistor may be connected with the PMOS transistor, and the NBTI compensating circuit may include the auxiliary PMOS transistor which is not exposed to an NBTI stress. The auxiliary PMOS transistor may be driven when the PMOS transistor is operated or at a start time of the PMOS transistor to improve the driving force of the PMOS transistor. In one example, the auxiliary PMOS transistor is selectively driven in a time section where the input signal IN is transited from a high level to a low level. Thus, the auxiliary PMOS transistor may improve the driving force of the PMOS transistor at the start time.

Further, the auxiliary PMOS transistor may be designed to not be operated in other time sections to minimize deterioration of the NBTI.

In example embodiments, the inverter may include the PMOS transistor. Alternatively, example embodiments may be applied to circuits including PMOS transistors such as a logic gate.

Figure 5:
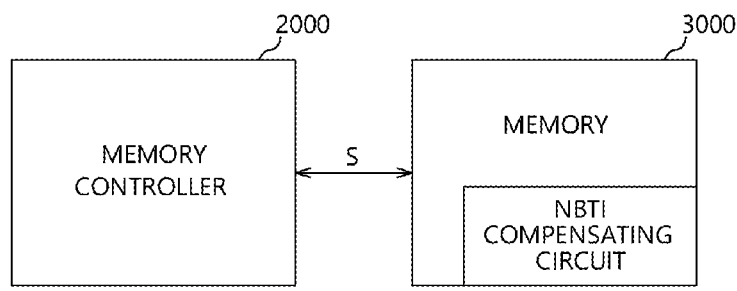
FIG. 5 is a block diagram illustrating a memory system in accordance with example embodiments.

FIG. 5 is a block diagram illustrating a memory system in accordance with example embodiments.

Referring to FIG. 5, a memory system 1000 may include a memory controller 2000 and a memory 3000. The memory 3000 may be in communication with the memory controller 2000 through a bus line S. The bus line S may include a bus configured to transmit addresses, data, commands, etc.

The memory 3000 may include the NBTI compensating circuit 100. The NBTI compensating circuit 100 may operate to compensate the driving force of a deteriorated PMOS transistor of the NBTI in the memory 3000 during a drive start time section such as a power-up time section or a normal time section. Therefore, malfunctions of the PMOS transistor may be improved.

NBTI compensating circuit 100 may be applied to devices including CMOS circuits. Thus, the memory 3000 may include a non-volatile memory such as a flash memory as well as a volatile memory such as DRAM, SRAM, SDRAM, etc.

The above embodiments of the present disclosure are illustrative and not limitative. Various alternatives and equivalents are possible. The example embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a main inverter configured to receive and reverse an input signal, the main inverter including a PMOS transistor and an NMOS transistor; and
   a negative bias temperature instability (NBTI) compensating circuit configured to receive the input signal, the NBTI compensating circuit selectively driven in an operation start time section of the PMOS transistor in the main inverter to compensate a driving force of the PMOS transistor,
   wherein the NBTI compensating circuit comprises:
   a first switch configured to be driven in a time section when the input signal is transited from a high level to a low level;
   an auxiliary inverter connected with the first switch, the auxiliary inverter including a PMOS transistor and an NMOS transistor;
   a PMOS blocking circuit configured to provide an input node of the auxiliary inverter with a power voltage when the input signal has a stable high level or a stable low level; and
   a second switch connected with an output node of the auxiliary inverter, the second switch which operates substantially the same as the first switch.

2. The semiconductor integrated circuit device of claim 1, wherein the PMOS transistor of the auxiliary inverter is designed to be selectively driven in a time section where the input signal is transited from the high level to the low level.

3. The semiconductor integrated circuit device of claim 1, wherein the NMOS transistor of the auxiliary inverter is designed to be driven in time sections except for the time section when the PMOS transistor of the auxiliary inverter is driven.

4. The semiconductor integrated circuit device of claim 1, wherein the PMOS transistor of the auxiliary inverter blocks operation of the PMOS transistor by the first switch and the PMOS blocking circuit.

5. The semiconductor integrated circuit device of claim 1, wherein the PMOS transistor of the auxiliary inverter is driven simultaneously with the driving of the PMOS transistor of the main inverter.

6. The semiconductor integrated circuit device of claim 1, wherein the first switch is opened by a first control signal and a second control signal to block the input signal inputted into the auxiliary inverter.

7. The semiconductor integrated circuit device of claim 1, wherein the main inverter is connected with an output node of the NBTI compensating circuit.

8. The semiconductor integrated circuit device of claim 7, further comprising a buffer connected with the output node of the main inverter and the NBTI compensating circuit.

9. A semiconductor integrated circuit device comprising:
   a core circuit including a PMOS transistor; and
   a negative bias temperature instability (NBTI) compensating circuit connected with the core circuit in parallel, the NBTI compensating circuit selectively driven in an operation start time section of the PMOS transistor in the core circuit to compensate a driving force of the PMOS transistor,
   wherein the NBTI compensating circuit includes:
   a first switch configured to be driven in a time section when the input signal is transited from a high level to a low level;
   an auxiliary inverter connected with the first switch, the auxiliary inverter including an auxiliary PMOS transistor and an NMOS transistor;
   a PMOS blocking circuit configured to provide an input node of the auxiliary inverter with a power voltage when the input signal has a stable high level or a stable low level; and
   a second switch connected with an output node of the auxiliary inverter, the second switch which operates substantially the same as the first switch.

10. The semiconductor integrated circuit device of claim 9, wherein the auxiliary PMOS transistor is not exposed to an NBTI stress, and the auxiliary PMOS transistor is designed to be driven when the PMOS transistor of the core circuit is operated.

11. The semiconductor integrated circuit device of claim 10, wherein the auxiliary PMOS transistor is selectively driven in a time section where an input signal is transited from a high level to a low level.

12. A semiconductor system comprising:
    a memory controller;
    a memory in communication with the memory controller; and
    a negative bias temperature instability (NBTI) compensating circuit arranged in the memory, the NBTI compensating circuit configured to compensate a driving force of a PMOS transistor in the memory,
    wherein the NBTI compensating circuit comprises:
    a first switch configured to be driven in a time section when an input signal inputted into the PMOS transistor is transited from a high level to a low level;
    an auxiliary inverter connected with the first switch, the auxiliary inverter including a PMOS transistor and an NMOS transistor;
    a PMOS blocking circuit configured to provide an input node of the auxiliary inverter with a power voltage when the input signal has a stable high level or a stable low level; and
    a second switch connected with an output node of the auxiliary inverter, the second switch which operates substantially the same as the first switch.

13. The semiconductor system of claim 12, wherein the memory includes a main inverter connected with the NBTI compensating circuit in parallel.

14. The semiconductor system of claim 13, further comprising a buffer connected with the output node.

* * * * *